United States Patent [19]

Ashida

[11] Patent Number: 5,659,202

[45] Date of Patent: Aug. 19, 1997

[54] SEMICONDUCTOR DEVICE WITH A PAIR OF DUMMY ELECTRODES BELOW AN INNER LEAD

[75] Inventor: Tsutomu Ashida, Nara, Japan

[73] Assignee: Sharp Kabushiki Kaisha, Osaka, Japan

[21] Appl. No.: 630,624

[22] Filed: Apr. 10, 1996

[30] Foreign Application Priority Data

Jan. 26, 1996 [JP] Japan ................................ 8-012121

[51] Int. Cl.$^6$ ................ H01L 23/29; H01L 27/118
[52] U.S. Cl. ............................................. 257/758
[58] Field of Search ........................... 257/758, 211, 257/207, 208, 210

[56] References Cited

U.S. PATENT DOCUMENTS

| 5,381,030 | 1/1995 | Kasai | 257/211 |

FOREIGN PATENT DOCUMENTS

| 60-79744 | 5/1985 | Japan | 257/758 |
| 1-152644 | 6/1989 | Japan | 257/758 |
| 1-303742 | 12/1989 | Japan | 257/758 |
| 2-260425 | of 1990 | Japan | 257/758 |
| 3-169073 | 7/1991 | Japan | 257/758 |
| 3-190236 | 8/1991 | Japan | |
| 3-263325 | 11/1991 | Japan | |
| 3-274764 | 12/1991 | Japan | 257/758 |
| 5-343540 | 12/1993 | Japan | 257/211 |
| 6-77223 | 3/1994 | Japan | |
| 6-97300 | 4/1994 | Japan | 257/758 |

*Primary Examiner*—Sara W. Crane
*Assistant Examiner*—Alexander Oscar Williams
*Attorney, Agent, or Firm*—Nixon & Vanderhye P.C.

[57] ABSTRACT

A semiconductor device is provided which comprises: a semiconductor chip having a semiconductor substrate, an insulation a film, a field oxide film and pads formed on a surface thereof; bumps respectively formed on the pads; inner leads bonded to the semiconductor chip with intervention of bumps; a metal interconnection formed in an indentation which is formed between the pads and an edge of the semiconductor chip by removing part of the insulation film and/or the field oxide film of the semiconductor chip; and a pair of dummy electrodes respectively formed between each of the pads and the metal interconnection and between the metal interconnection and the edge of the chip at a higher elevation than the metal interconnection and spaced apart a predetermined distance from the metal interconnection, the pair of dummy electrodes being provided for each of the inner leads, which is located thereabove.

15 Claims, 5 Drawing Sheets

SEMICONDUCTOR DEVICE WITH A PAIR OF DUMMY ELECTRODES BELOW AN INNER LEAD

BACKGROUND OF THE INVENTION

1. Field of the Invention

The present invention relates to a semiconductor device and, more particularly, to a semiconductor device fabricated with a chip design for preventing an inner lead from contacting an edge and a metal interconnection of a semiconductor chip of a tape carrier package (TCP) which is one type of semiconductor packages.

2. Description of Related Arts

A tape carrier package is one type of conventional semiconductor device. In the semiconductor device of this type, as shown in FIG. 5, an external interconnection (inner lead) 11 is bonded to a bump 9 which is formed on a surface of a semiconductor chip 1a having various devices and circuits with intervention of a pad (not shown).

To fabricate the semiconductor package with the aforesaid construction, the semiconductor chip 1a having the bump 9 is set on a bonding stage 16. In turn, the bump 9 is positioned in alignment with the inner lead 11 extending from a device hole for mounting a chip of a tape carrier 15. Thereafter, the inner lead 11 and the bump 9 are heated and pressed by means of a bonding tool 14 for eutectic bonding therebetween. The bump 9 and the inner lead 11 are generally plated with gold and tin, respectively, and therefore the bonding between the bump 9 and the inner lead 11 is achieved by forming a eutectic alloy of gold and tin therebetween.

The pad of the semiconductor chip is generally formed in a peripheral region of the chip. In some cases, a metal interconnection such as a power supply line is provided between the pad and an edge of the chip because of restriction on circuit arrangement. As shown in FIGS. 6 and 7, an insulation film 5 is formed in a device formation region on an active region and a field oxide film 2 which is formed on a region other than the active region of a semiconductor substrate 1, and the metal interconnection 17 is formed on this insulation film 5. The inner lead 11 crosses the metal interconnection 17 as shown in FIG. 6. The semiconductor substrate 1 is exposed along an edge 12 of the semiconductor chip 1a, because boundaries of a plurality of chips formed on a wafer are defined by scribed lines for dieing the chips out of the wafer.

When the inner lead 11 is bonded to the semiconductor chip 1a at bump 9 on pad 13, heat of the bonding tool 14 is conducted to the inner lead 11, thereby causing the inner lead 11 to sag down due to thermal expansion thereof. Further, the eutectic alloy formed between the bump 9 and inner lead 11 and tin of the tin-plated inner lead 11 are melted by the heat of the bonding tool 14 and sag on the semiconductor chip to pressure it or cause the positional offset of the bonding tool 14. This deteriorates the aforesaid problem. In the worst case, a crack occurs in an insulation film 10 formed on the metal interconnection 17, resulting in a short circuit between the metal interconnection 17 and the inner lead 11 or between the inner lead 11 and the edge 12 of the semiconductor chip 1 or in the corrosion of the metal interconnection 17 due to moisture penetrating from the crack.

There has been proposed a method for forming a metal interconnection in an indentation such as formed between dummy electrodes to prevent the metal interconnection from being slidingly offset when a lateral stress is applied to the semiconductor chip. However, no consideration is given to the aforesaid problem concerning the bonding of the inner lead. The dummy electrodes are useless to prevent the inner lead from sagging due to heat or from being short-circuited to the edge of the semiconductor chip. Further, there is a possibility that a plurality of inner leads are short-circuited to one dummy electrode since the inner leads cross the dummy electrode extending parallel to the metal interconnection. In such an event, an unintended signal is applied to the pad via the dummy electrode, resulting in an erroneous operation of the semiconductor device.

SUMMARY OF THE INVENTION

The present invention provides a semiconductor device comprising: a semiconductor chip having a semiconductor substrate, an insulation film, a field oxide film and pads formed on a surface thereof; bumps respectively formed on the pads; inner leads bonded to the semiconductor chip with intervention of bumps; a metal interconnection formed in an indentation which is formed between the pads and an edge of the semiconductor chip by removing part of the insulation film and/or the field oxide film of the semiconductor chip; and a pair of dummy electrodes respectively formed between each of the pads and the metal interconnection and between the metal interconnection and the edge of the chip at a higher elevation than the metal interconnection and spaced apart a predetermined distance from the metal interconnection, the pair of dummy electrodes being provided for each of the inner leads, which is located thereabove.

DETAILED DESCRIPTION OF THE PREFERRED EMBODIMENTS

A semiconductor chip according to the present invention includes various devices such as a transistor, a capacitor and a resistor and circuits, which are interconnected via interconnection layers and protected by an insulation film or the like. Bumps are preferably formed on pads which are exposed on a surface of the semiconductor chip formed with these devices and circuits. Materials to be used for the formation of the pads are not particularly limited, but examples thereof include conductive materials such as Al, TiW, Au, Ti and Cu which are typically used as an electrode material. Exemplary materials for the bumps include solder, gold, and the aforesaid materials for the pads. Inner leads are bonded to the pads of the semiconductor chip via the bumps for fabrication of the semiconductor device.

In the semiconductor device of the present invention, a metal interconnection such as a power supply line is disposed between the pads formed on the semiconductor chip and a chip edge. The metal interconnection is provided: (1) in an indentation formed as reaching a surface of the semiconductor substrate by removing part of an insulation film of the semiconductor chip in a region where no field oxide film is provided; (2) in an indentation formed as reaching a surface of the field oxide film by removing part of the insulation film in a region where the field oxide film is formed or in an indentation formed as reaching the surface of the semiconductor substrate by removing parts of the insulation film and the field oxide film; or (3) in an indentation formed directly on the semiconductor substrate by etching part of a surface portion of the semiconductor substrate. Materials to be used for the metal interconnection are not particularly limited, but examples thereof include Al, AlSi, AlCu, AlSi/TiW, AlTi, TiN and the like which are typically used as a conductive material. The thickness and width of the metal interconnection vary depending on the size and the like of a semiconductor device to be obtained. For example, the thickness is preferably about 500 nm to about 1,200 nm, more preferably about 700 nm to about 900 nm. The width is preferably about 0.2 µm to about 20 µm.

Figure 1:
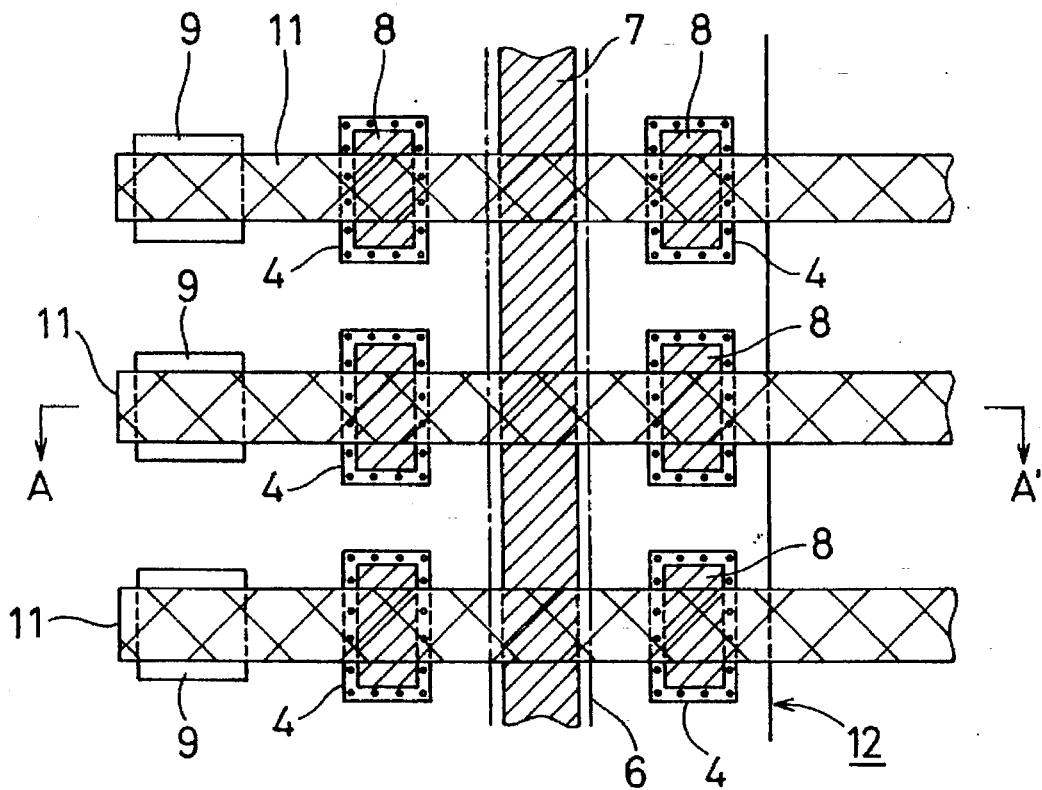
FIG. 1 is a schematic plan view illustrating connection between a semiconductor chip and inner leads in accordance with the present invention.

A pair of dummy electrodes are respectively formed between each of the pads and the metal interconnection and between the metal interconnection and the edge of the semiconductor chip in the state of single-layer or double-layer, or multiple-layer structure. Pairs of dummy electrodes corresponding to the respective inner leads are preferably separated from each other as shown in FIG. 1. The configuration of the dummy electrodes is not particularly limited as long as the dummy electrodes are spaced apart a predetermined distance from the metal interconnection around the intersections of the inner leads and the dummy electrodes. Each of the dummy electrodes is preferably formed into a rectangular shape which extends generally parallel to the metal interconnection. Exemplary materials for the dummy electrodes include Al, AlSi, AlCu, AlSi/TiW, AlTi, TiN, polysilicon, silicides of polysilicon and high-melting-point metals, and polycides of such. silicides and polysilicon. The thickness and width of the dummy electrodes are about 200 nm to about 1,000 nm and about 0.2 µm to about 10 µm, respectively.

Where the dummy electrodes are of the single-layer structure, the dummy electrodes are formed on the field oxide film so that the upper faces thereof are located at a higher elevation than the metal interconnection, or the dummy electrodes are formed on a region where there is no field oxide film so that the upper faces thereof are located at a higher elevation than the metal interconnection. The dummy electrodes may be formed, for example, along with a gate electrode of a transistor to be formed on the semiconductor substrate in a single process by using the same material as the gate electrode. The configuration of the dummy electrodes is such that the gate electrode can be electrically isolated therefrom. Alternatively, the dummy electrodes can be formed along with an interconnection layer other than the gate electrode, the pads or the like in a single process by using the same material. Instead of dummy electrode, the insulaters like $SiO_2$, SiN, etc., can form the elevation difference between the upper surface of the insulaters and the surface of the metal by adding the extra process steps.

Where the dummy electrodes are of the double-layer structure, first layers of the respective dummy electrodes may be formed in the aforesaid manner, on which second layers thereof are formed with intervention of an insulation film. In this case, the upper faces of the second layers of the dummy electrodes may be located at a higher elevation than the metal interconnection. An interlayer insulation film for covering the devices formed on the semiconductor substrate can be used as the insulation film and may be, for example, formed of a single-layer film or lamination of $SiO_2$, SiN, BPSG, BSG and the like. Where the dummy electrodes are to be formed on the interlayer insulation film, the dummy electrodes may be formed, for example, along with the metal interconnection for interconnecting the devices in a single process by using the same material as the metal interconnection. The configuration of the dummy electrodes is such that the metal interconnection can be electrically isolated therefrom.

Even if the inner leads sink or sag, the inner leads are supported by the dummy electrodes which are electrically isolated from the metal interconnection and, therefore, direct contact to the edge of the semiconductor or the metal interconnection can be prevented because the dummy electrodes are located at a higher elevation than the metal interconnection. Further, short circuit between an inner lead and a dummy electrode only causes the dummy electrode to be kept at the same potential as the inner lead and may not produce any adverse effect, because the respective pairs of dummy electrodes are separated from each other. The provision of the second-layer dummy electrode on the first-layer dummy electrode increases the elevation difference between the upper surface of the second-layer the dummy electrode and the surface of the metal interconnection, thereby more assuredly preventing the metal interconnection from contacting the inner lead or the edge of the semiconductor chip. The amount of the sag of the inner leads should be estimated in consideration of the bonding temperature and the coefficient of linear thermal expansion of the inner lead material to determine an appropriate depth of the indentation. The depth of the indentation should be greater than the estimated amount of the sag. The construction of the dummy electrodes (i.e., whether the dummy electrodes are of the single-layer structure or of the double-layer structure and whether or not the field oxide film is provided under the metal interconnection) may be appropriately determined depending on the depth of the indentation.

Where the metal interconnection which is formed directly on the semiconductor substrate is applied with a potential different from that to be applied to the semiconductor substrate, an impurity diffusion layer having a conductivity type different from that of the semiconductor substrate is preferably formed under the metal interconnection to isolate the metal interconnection from the semiconductor substrate. Where the metal interconnection is to be applied with the same potential as that to be applied to the semiconductor substrate, an impurity diffusion layer having the same conductivity type as that of the semiconductor substrate may be formed under the metal interconnection. The diffusion layer may be formed, for example, along with a diffusion layer of a transistor to be formed on the semiconductor substrate. In this case, the concentration of a P-type or N-type impurity is preferably about $10^{15}$ ions/cm$^3$ to about $10^{20}$ ions/cm$^3$.

Although the aforesaid explanation for the semiconductor device in accordance with the present invention is directed to the tape carrier package (TCP), the present invention can be applied to a wire-bonded semiconductor device in substantially the same manner.

With reference to the attached drawings, the present invention will be described by way of embodiments thereof. It should be understood that the embodiments are not limitative of the present invention.

EXAMPLE 1

Figure 2:
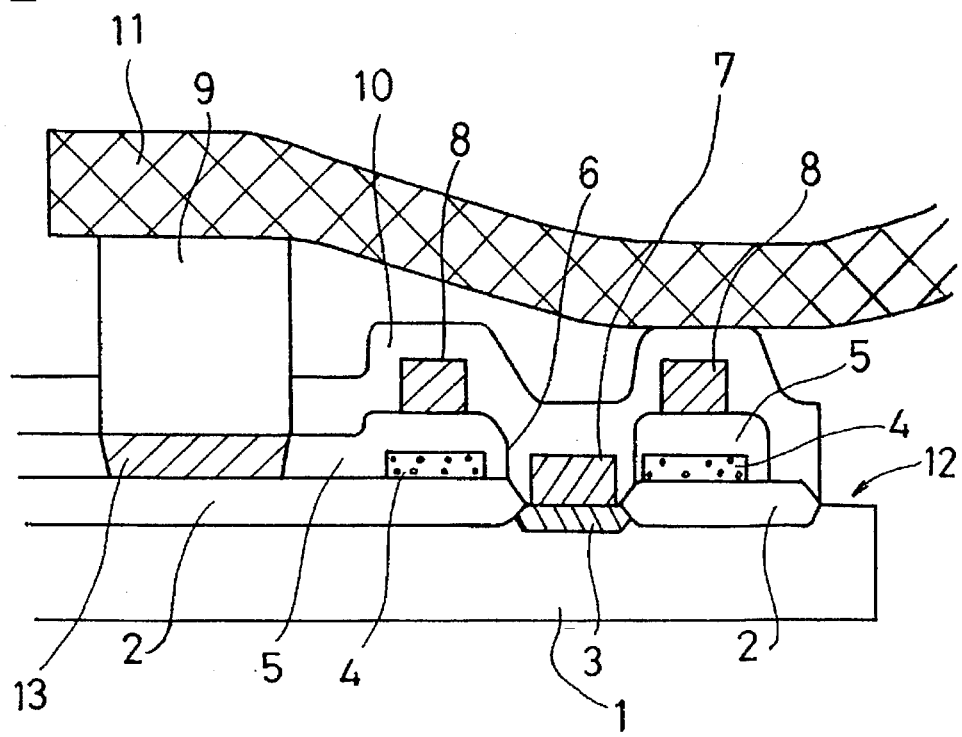
FIG. 2 is a schematic sectional view taken along a line A-A' in FIG. 1 (in case that the semiconductor chip is of a double-layer dummy electrode structure)

As shown in FIGS. 1 and 2, the semiconductor device of the present invention essentially consists of a silicon substrate 1, an about 1.0 μm-thick field oxide film 2 formed on the silicon substrate 1, a diffusion layer 3 formed in the silicon substrate 1, about 0.5 μm-thick first dummy electrodes 4 formed on the field oxide film 2, and about 0.9 μm-thick insulation films 5 formed on the first dummy electrodes 4. Second dummy electrodes 8 are provided on the respective first dummy electrodes 4 with intervention of the insulation films 5. An indentation 6 is formed directly on the diffusion layer 3 of the silicon substrate 1 between the first dummy electrodes 4 (second dummy electrodes 8), and a metal interconnection 7 is formed in the indentation 6. A bump 9 is provided on a pad 13 formed on the silicon substrate 1, and an inner lead 11 extending across the second dummy electrodes 8 and the metal interconnection 7 is bonded to the bump 9. Where the metal interconnection 7 is to be applied with the same potential as that to be applied to the silicon substrate 1, the diffusion layer 3 is preferably of the same conductivity type as the silicon substrate 1. Where the metal interconnection 7 is to be applied with a potential different from that to be applied to the silicon substrate 1, the diffusion layer 3 is preferably of a conductivity type different from that of the silicon substrate 1.

Since the metal interconnection 7 is formed directly on the silicon substrate 1 in the semiconductor device of the above, the elevation difference between the second dummy electrodes 8 on the field oxide film 2 and the metal interconnection 7 equals the sum (1.9 μm) of half the thickness of the field oxide film 2 (0.5 μm), the thickness (0.5 μm) of the first dummy electrode 4 and the thickness (0.9 μm) of the insulation film 5. Therefore, the elevation difference is significantly greater than the thickness of the metal interconnection 7. Even if the inner lead 11 sags to break the insulation film 10, the second dummy electrodes 8 on the field oxide film 2 support the inner lead 11, thereby preventing the inner lead 11 from being short-circuited to the metal interconnection 7 or a chip edge 12.

There will next be explained a fabrication method for the semiconductor device as shown in FIG. 2.

An about 1.0 μm-thick field oxide film 2 is formed on a silicon substrate 1 by an LOCOS method. At this time, the field oxide film 2 is not formed in a region where a metal interconnection 7 is to be formed.

In turn, a polysilicon layer is deposited in a thickness of about 0.5 μm on the entire surface of the resulting substrate with intervention of a gate insulation film, and patterned into a desired configuration to form a gate electrode (not shown) and first dummy electrodes 4 which are to be located on the both sides of the metal interconnection 7 to be formed in a later process.

To form a source/drain diffusion layer (not shown), ion implantation is performed. At this time, a diffusion layer 3 is also formed in a region where no field oxide film 2 is formed. An interlayer insulation film 5 is formed on the gate electrode and the first dummy electrodes 4. Simultaneously with the formation of a contact hole in the interlayer insulation film 5, an indentation 6 is formed as reaching the silicon substrate 1 formed with the diffusion layer 3 between the first dummy electrodes 4.

Subsequently, a conductive layer is formed on the resulting substrate including the contact hole and the indentation 6, and patterned into a desired configuration to form a pad 13, second dummy electrodes 8 and the metal interconnection 7. An insulation film 10 is formed on the resulting substrate including the pad 13, the metal interconnection 7 and the second dummy electrodes 8 to protect the surface of the semiconductor chip.

Thereafter, a bump 9 for connecting to the pad 13 of the semiconductor chip is formed by a known method. The inner lead 11 is bonded to the bump 9 by using a bonding tool or the like. Thus, the semiconductor device is completed.

EXAMPLE 2

Figure 3A:
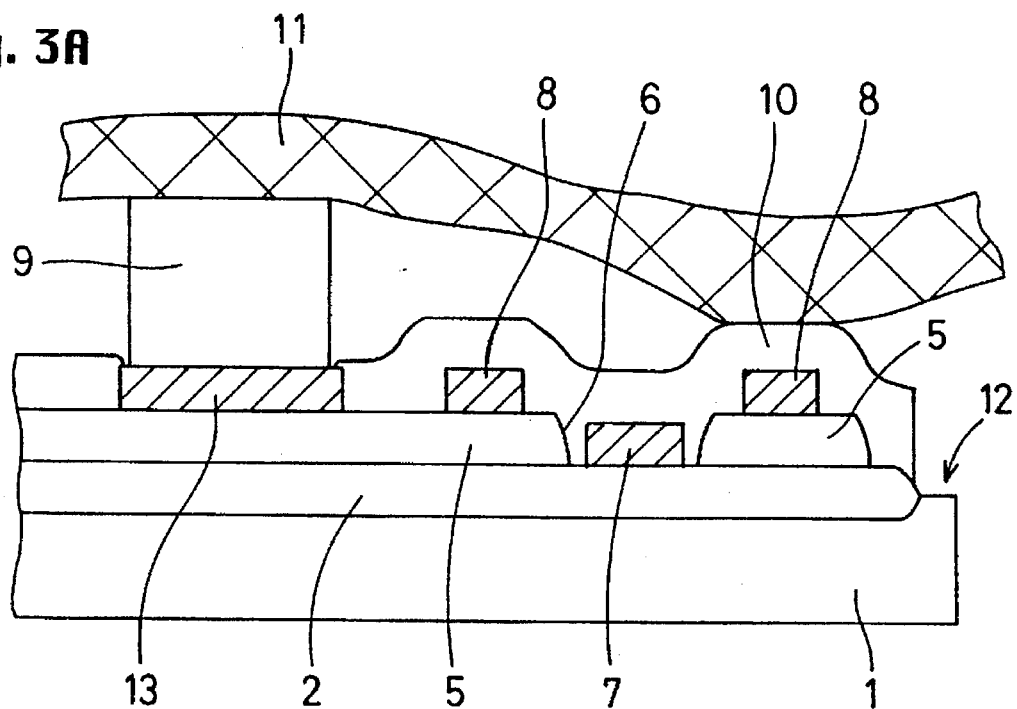
FIG. 3A is a schematic sectional view taken along a line A-A' in FIG. 1 (in case that the semiconductor chip is of a single-layer dummy electrode structure)

There will next be described another semiconductor device in accordance with the present invention. As shown in FIG. 3A, the semiconductor device essentially consists of a silicon substrate 1, an about 1.0 μm-thick field oxide film 2 formed on the silicon substrate 1 and an about 0.9 μm-thick insulation film 5 formed on the field oxide film 2. An indentation 6 is formed by removing part of the insulation film 5. A metal interconnection 7 is formed in the indentation 6, and about 0.5 μm-thick dummy electrodes 8 are disposed parallel to the metal interconnection 7 on the insulation film 5. Another insulation film 10 is provided on the dummy electrodes 8. A bump 9 is disposed on a pad 13 formed on the silicon substrate 1, and an inner lead 11 extending across the dummy electrodes 8 and the metal interconnection 7 is bonded to the bump 9.

In the semiconductor device of the above, the metal interconnection 7 is formed on the field oxide film 2 as described above. Therefore, the elevation difference between the dummy electrodes 8 and the metal interconnection 7 equals the thickness (0.9 μm) of the insulation film 5, which is greater than the thickness of the metal interconnection 7. Even if the inner lead 11 sags to break the insulation film 10 when the inner lead 11 is bonded to the bump 9, the dummy electrodes 8 formed on the insulation film 5 support the inner lead 11, thereby preventing the inner lead 11 from being short-circuited to the metal interconnection 7 or a chip edge 12.

The semiconductor device may be fabricated in substantially the same manner as the aforesaid fabrication method.

EXAMPLE 3

There will next be described still another semiconductor device in accordance with the present invention.

Figure 4:
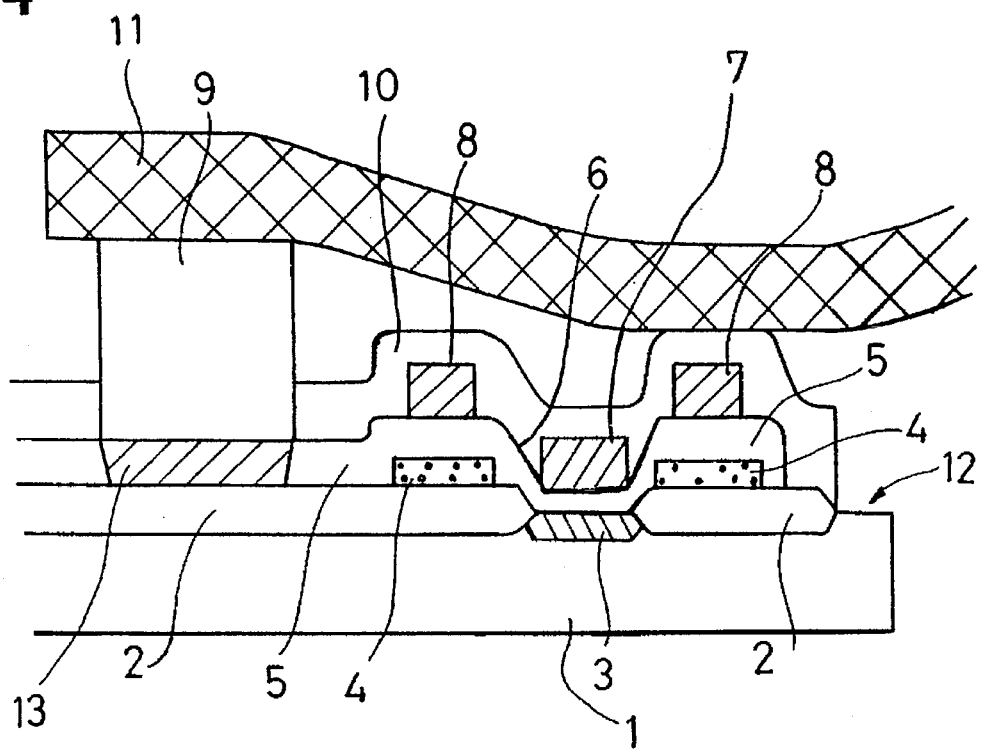
FIG. 4 is a schematic sectional view taken along a line A-A' in FIG. 1 (in case that the semiconductor chip is of another double-layer dummy electrode structure)
Figure 5:
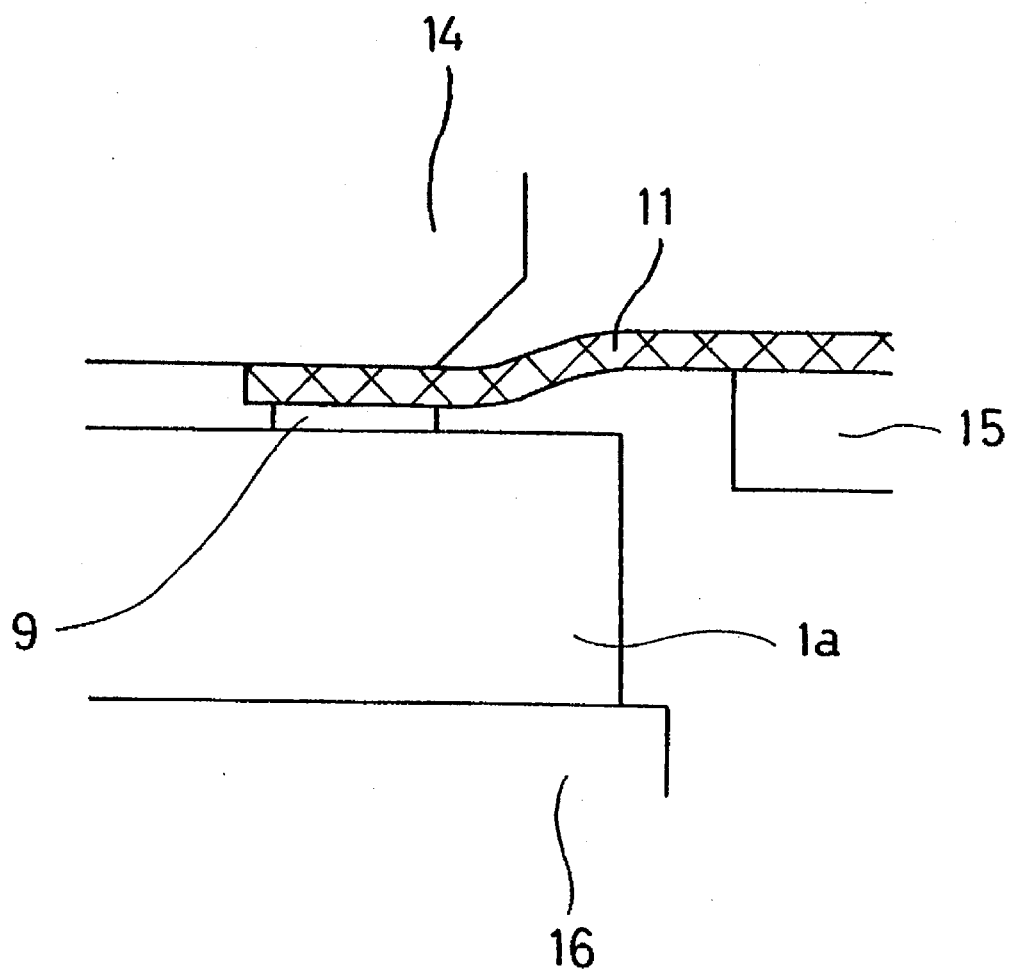
FIG. 5 is a diagram for explaining an inner lead bonding process.
Figure 6:
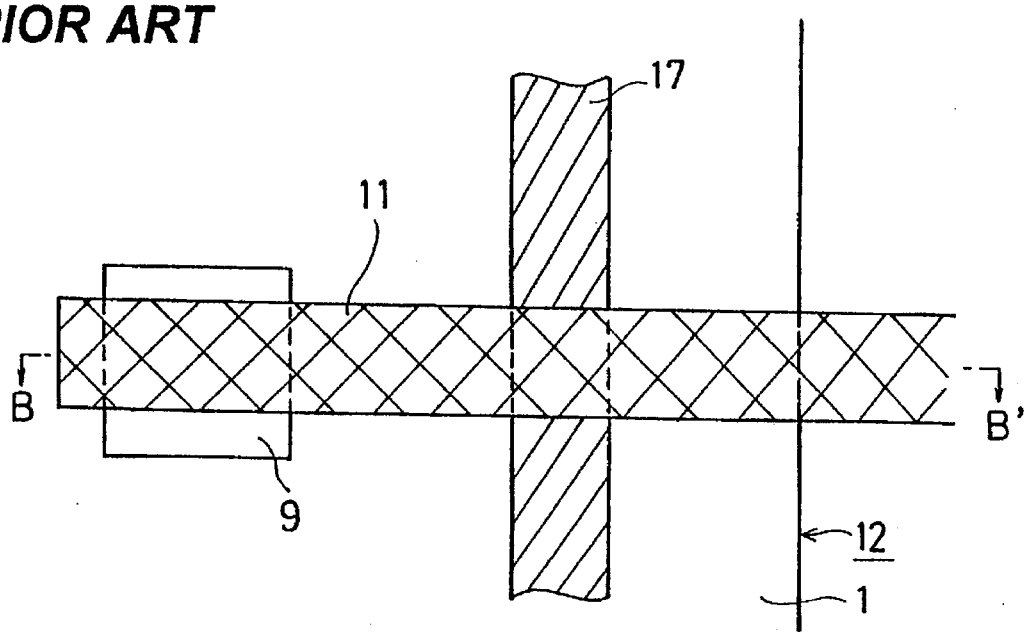
FIG. 6 is a schematic plan view illustrating connection between a semiconductor chip and an inner lead in a prior art.
Figure 7:
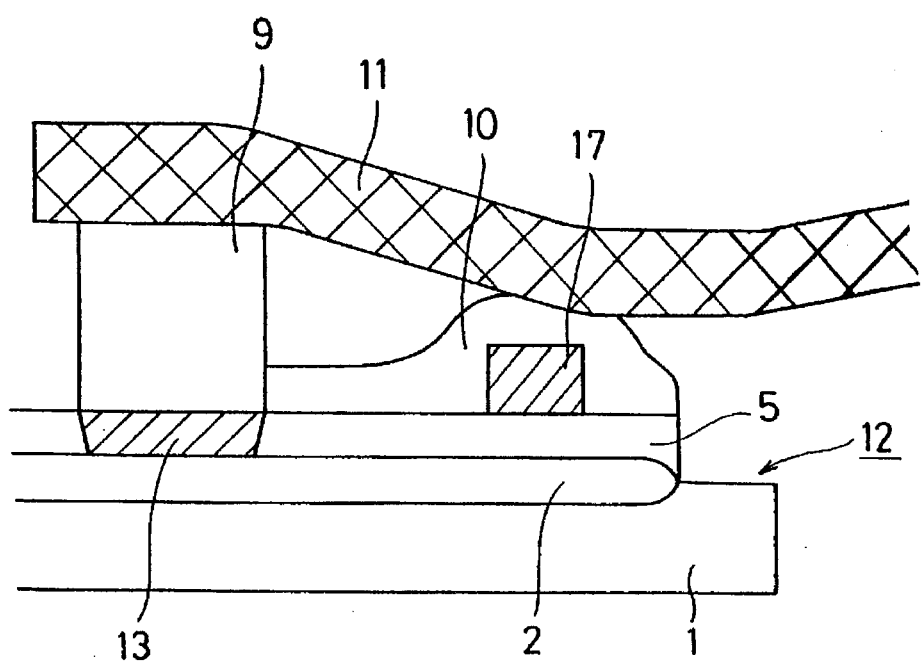
FIG. 7 is a schematic sectional view taken along a line B-B' in FIG. 6.

As shown in FIGS. 1 and 4, the semiconductor device of the present invention essentially consists of a silicon substrate 1, an about 1.0 μm-thick field oxide film 2 formed on the silicon substrate 1, a diffusion layer 3 formed in the silicon substrate 1, about 0.5 μm-thick first dummy electrodes 4 formed on the field oxide film 2, and about 0.9 μm-thick insulation films 5 formed on the first dummy electrodes 4. Second dummy electrodes 8 are provided on the respective first dummy electrodes 4 with intervention of the insulation films 5. An indentation 6 is formed on a region in which the field oxide film 2 is not formed on the silicon substrate 1 between the first dummy electrodes 4 (second dummy electrodes 8), and a metal interconnection 7 is formed in the indentation 6. A bump 9 is provided on a pad 13 formed on the silicon substrate 1, and an inner lead 11 extending across the second dummy electrodes 8 and the metal interconnection 7 is bonded to the bump 9.

Since the metal interconnection 7 is formed on a region in which a field oxide film 5 is not formed on the silicon substrate 1 in the semiconductor device of the present invention, the elevation difference between the second dummy electrodes 8 on the field oxide film 2 and the metal interconnection 7 equals the sum (1.0 µm) of half the thickness of the field oxide film 2 (0.5 µm), and the thickness (0.5 µm) of the first dummy electrode 4. Therefore, the elevation difference is significantly greater than the thickness of the metal interconnection 7. Even if the inner lead 11 sags to break the insulation film 10, the second dummy electrodes 8 on the field oxide film 2 support the inner lead 11, thereby preventing the inner lead 11 from being short-circuited to the metal interconnection 7 or a chip edge 12.

There will next be explained a fabrication method for the semiconductor device as shown in FIG. 4. An about 1.0 µm-thick field oxide film 2 is formed on a silicon substrate 1 by an LOCOS method. At this time, the field oxide film 2 is not formed in a region where a metal interconnection 7 is to be formed.

In turn, a polysilicon layer is deposited in a thickness of about 0.5 µm on the entire surface of the resulting substrate with intervention of a gate insulation film, and patterned into a desired configuration to form a gate electrode (not shown) and first dummy electrodes 4 which are to be located on the both sides of the metal interconnection 7 to be formed in a layer process.

To form a source/drain diffusion layer (not shown), ion implantation is performed. At this time, a diffusion layer 3 is also formed in a region where no field oxide film 2 is formed. If formation of the diffusion layer 3 is to be avoided, an additional mask may be formed to prevent impurity ions from being implanted into the region. An interlayer insulation film 5 is formed on the gate electrode and the first dummy electrodes 4. In the interlayer insulation film 5, a contact hole (not shown) is formed.

Subsequently, a conductive layer is formed on the resulting substrate including the contact hole and the indentation 6, and patterned into a desired configuration to form a pad 13, second dummy electrodes 8 and the metal interconnection 7. An insulation film 10 is formed on the resulting substrate including the pad 13, the metal interconnection 7 and the second dummy electrodes 8 to protect the surface of the semiconductor chip.

Thereafter, a bump 9 for connecting to the pad 13 of the semiconductor chip is formed by a known method. The inner lead 11 is bonded to the bump 9 by using a bonding tool or the like. Thus, the semiconductor device is completed.

EXAMPLE 4

Figure 3B:
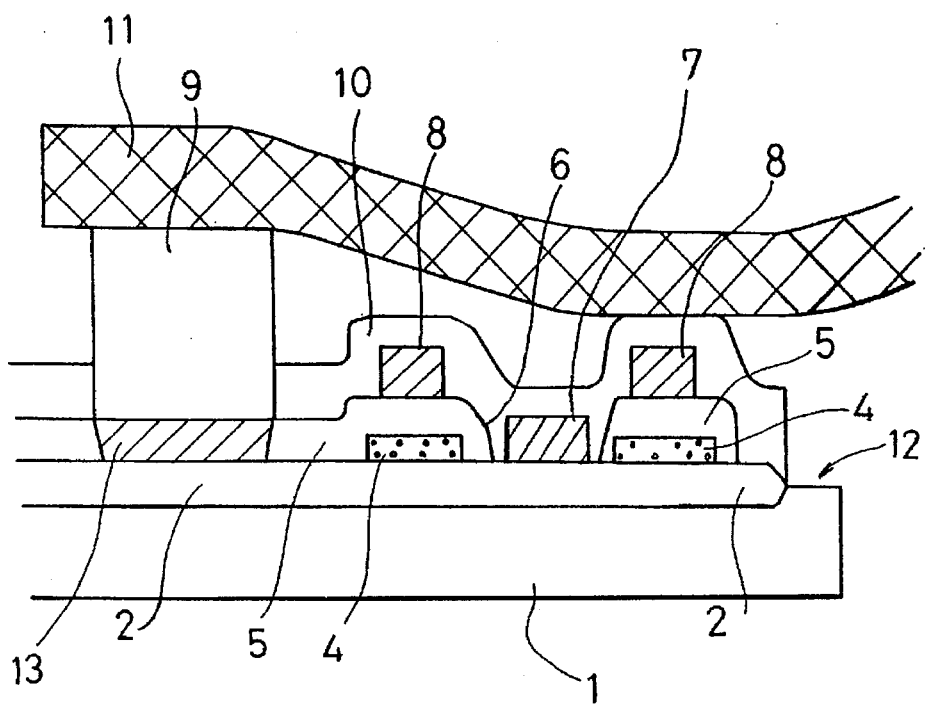
FIG. 3B is a schematic sectional view taken along a line A-A' in FIG. 1 (in case that the semiconductor chip is of a double-layer dummy electrode structure)

As shown in FIG. 3B, the semiconductor device is constructed in such a manner that the dummy electrode of the device shown in FIG. 3A are formed in a double-layer structure shown in FIG. 4.

In accordance with the present invention, even if the inner lead sinks or sags, the dummy electrodes support the inner lead to prevent the inner lead from being short-circuited to the metal interconnection and/or the edge of the semiconductor chip because the dummy electrodes are disposed at a higher elevation than the metal interconnection. Further, the dummy electrodes of the single-layer or double-layer structure can be formed simultaneously with the formation of other interconnection. Therefore, an additional process step is not required.

Even if breakage of a protection film formed on a dummy electrode causes the inner lead to be short-circuited to the dummy electrode, the dummy electrode is only kept at the same potential as that applied to the pad, because the dummy electrode is electrically isolated from the other portions. Therefore, no erroneous operation occurs in the semiconductor device.

Where the metal interconnection is provided directly on the semiconductor substrate in the indentation, the short circuit between the metal interconnection and the inner lead located above the metal interconnection can be more assuredly prevented. In addition, the formation of the metal interconnection in the indentation can be readily achieved by modifying the configuration of a photomask for the formation of the field oxide film.

Since there is no fear that the inner lead contacts or is short-circuited to the semiconductor chip during the inner lead bonding process, the setting of the bonding conditions can be facilitated, and the yield and reliability in the inner lead bonding process can be improved.

What is claimed:

1. A semiconductor device comprising:

a semiconductor chip having a semiconductor substrate, an insulation film, a field oxide and pads formed on the field oxide;

bumps formed on the pads;

inner leads for making external connections to the chip bonded to the pads at the bumps and extending in spaced apart relationship above and beyond an edge of the chip;

a metal interconnection formed in an indentation which is formed between the pads and the edge of the chip, the indentation being formed in at least one of the insulation film and the field oxide;

a pair of dummy electrodes respectively formed between each of the pads and the metal interconnection and between the metal interconnection and the edge of the chip at a higher elevation than the metal interconnection and spaced apart a predetermined distance from the metal interconnection, the pair of dummy electrodes being provided for each of the inner leads, which is located there above, and separate from other pairs of dummy electrodes provided for other inner leads.

2. A semiconductor chip as set forth in claim 1, wherein the metal interconnection is formed directly on the semiconductor substrate in the indentation.

3. A semiconductor device as set forth in claim 1, wherein the dummy electrode is formed as a single-layer structure.

4. A semiconductor chip as set forth in claim 1, wherein the dummy electrode is a film formed simultaneously with the formation of the metal interconnection about 200 nm to 1000 nm in thickness and about 0.2 µm to 10 µm in width.

5. A semiconductor chip as set forth in claim 1, wherein the dummy electrode is a film formed simultaneously with the formation of the metal interconnection.

6. A semiconductor device as set forth in claim 2, wherein a diffusion layer is formed in the semiconductor substrate where the metal interconnection is formed directly on the semiconductor substrate.

7. A semiconductor device as set forth in claim 6, wherein the diffusion layer and the semiconductor substrate are of the same conductivity type.

8. A semiconductor device as set forth in claim 6, wherein the diffusion layer and the semiconductor substrate are of opposite conductivity type.

9. A semiconductor device as in claim 1 wherein the dummy electrodes are formed as a double-layer structure.

10. A semiconductor device as in claim 1 wherein an insulating film is formed over the pair of dummy electrodes.

11. A semiconductor device comprising;

a semiconductor substrate, a field oxide film formed on one surface of the substrate, a contact pad formed on the field oxide film, an insulating film with a through-hole at the contact pad formed on the field oxide film, a bump formed on the contact pad in the through-hole and extending above the insulating film, an inner lead bonded at one end to the contact pad at the bump and suspended over the insulating film and an edge of the substrate, a metal interconnection formed between the contact pad and the edge of the substrate and crossing under the inner lead, and means for preventing the inner lead from sagging into contact with said metal interconnection and the edge of the substrate, said means comprising a pair of dummy electrodes with one of the dummy electrodes disposed below the inner lead, between and spaced from the contact pad and the metal interconnection, and with the other of the dummy electrodes disposed below the inner lead, between and spaced from the metal interconnection and the edge of the substrate.

12. A semiconductor device as in claim 11 wherein each dummy electrode is formed as a double-layer structure.

13. A semiconductor device as in claim 11 wherein each dummy electrode is of a predetermined limited area.

14. A semiconductor device as in claim 13 wherein each dummy electrode extends above the height of the metal interconnection.

15. A semiconductor device as in claim 11 including a plurality of contact pads and a plurality of inner leads bonded to the contact pads by bumps, the plurality of inner leads being suspended over the insulating film and extending over the edge of the substrate with the metal interconnection formed between the pads and the edge of the substrate, and a plurality of said means for preventing the inner leads from sagging into contact with said metal interconnection and the edge of the substrate, one such means for each inner lead, wherein the one dummy electrode of each pair and the other dummy electrode of each pair, each comprises a discrete electrode disposed in a line of discrete dummy electrodes parallel to the metal interconnection.

* * * * *